United States Patent
Romano et al.

(10) Patent No.: US 8,282,847 B2
(45) Date of Patent: Oct. 9, 2012

(54) PHOTORESIST DOUBLE PATTERNING

(75) Inventors: Andrew R. Romano, Pleasanton, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 396 days.

(21) Appl. No.: 12/338,947

(22) Filed: Dec. 18, 2008

(65) Prior Publication Data

US 2009/0162790 A1    Jun. 25, 2009

Related U.S. Application Data

(60) Provisional application No. 61/016,404, filed on Dec. 21, 2007.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/311* | (2006.01) |

(52) U.S. Cl. ............. 216/47; 216/49; 438/694; 438/699

(58) Field of Classification Search .................. None
See application file for complete search history.

(56) References Cited

U.S. PATENT DOCUMENTS

| | | | |
|---|---|---|---|
| 2004/0151844 A1* | 8/2004 | Zhang et al. | 427/569 |
| 2005/0103749 A1* | 5/2005 | Puech et al. | 216/68 |
| 2006/0127821 A1* | 6/2006 | Yagi | 430/322 |
| 2006/0172540 A1* | 8/2006 | Marks et al. | 438/700 |
| 2006/0290012 A1 | 12/2006 | Sadjadi | |
| 2007/0264830 A1 | 11/2007 | Huang et al. | |
| 2008/0171446 A1* | 7/2008 | Kim et al. | 438/761 |

FOREIGN PATENT DOCUMENTS

| | | |
|---|---|---|
| KR | 10-2006-0064861 | 6/2006 |
| KR | 1020060064861 A * | 6/2006 |

OTHER PUBLICATIONS

Translation of Korean Patent Application Publication KR1020060064861A, Shin et al., Jun. 2006.*
Search Report dated Jul. 15, 2009 from International Application No. PCT/US2008/086095.
Written Opinion dated Jul. 15, 2009 from International Application No. PCT/US2008/086095.

* cited by examiner

*Primary Examiner* — Shamim Ahmed
*Assistant Examiner* — Bradford Gates
(74) *Attorney, Agent, or Firm* — Beyer Law Group LLP

(57) ABSTRACT

A method for etching an etch layer formed on a substrate is provided. A first photoresist (PR) mask with first mask features is provided on the etch layer. A protective coating is provided on the first PR mask by a process including at least one cycle. Each cycle includes (a) a deposition phase for depositing a deposition layer over the surface of the first mask features using a deposition gas, and (b) a profile shaping phase for shaping the profile of the deposition layer using a profile shaping gas. A liquid PR material is applied over the first PR mask having the protective coating. The PR material is patterned into a second mask features, where the first and second mask features form a second PR mask. The etch layer is etched though the second PR mask.

10 Claims, 7 Drawing Sheets

PHOTORESIST DOUBLE PATTERNING

This application claims the benefit of priority of U.S. Provisional Application No. 61/016,404, filed on Dec. 21, 2007, which is incorporated herein by reference.

BACKGROUND OF THE INVENTION

The present invention relates to the formation of semiconductor devices. More specifically, the present invention relates to etching through a patterned mask.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. Presently, for 248 nm photoresist a typical critical dimension (CD) for the photoresist may be 130-250 nm using conventional processes. Due to optical properties dependent on wavelength, photoresist exposed by longer wavelength light has larger theoretical minimal critical dimensions. In order to provide features with smaller CD, features formed using shorter wavelength light are being pursued. 193 nm photoresist is exposed by 193 nm light. Using phase shift reticles and other technology, a 55-100 nm CD photoresist pattern may be formed using 193 nm photoresist. This would be able to provide a feature with a CD of 90-100 nm. 193 nm Immersion photoresist is exposed by 193 nm light with water in direct contact with the wafer surface. Using phase shift reticles and other technology 55 nm CD photoresist patterns may be formed and this will be extended in the future. This would be able to provide a feature with a sub 90 nm CD. EUV (13 nm) photoresist is exposed by 13 nm light. Using this technology sub 22 nm CD photoresist patterns may be formed. This would be able to provide a feature with a sub 55 nm CD.

The use of shorter wavelength photoresists may provide additional problems over photoresists using longer wavelengths. To obtain CD's close to the theoretical limit, the lithography apparatus should be more precise, which would require more expensive lithography equipment. Shorter wavelength photoresists may not have selectivities as high as longer wavelength photoresists and may more easily deform under plasma etch conditions (except for EUV photoresists which typically use 248 nm based backbones for their base polymers).

For photolithography printing, 193 nm immersion scanners for PR patterns have reached their limit in terms of the size of the optics which determines the maxim resolution, i.e., the minimum pattern size they can print. In order to go beyond the optical limit, for example, to achieve a half-pitch pattern, the design pattern may be split into two masks. For example, in a dual line approach, a first PR mask pattern (with a first set of lines) is printed using a first mask, and then a second PR pattern (with a second set of lines) is printed using a second mask. The combination of the first and second sets of lines will reduce the line pitch to a one-half. Such an approach is referred to as "double patterning" or "litho-etch-litho-etch" process. Conventional litho-etch-litho-etch process typically involves etching a hardmask twice: first through the first PR mask and then through the second PR mask. Certain litho-etch-litho-etch processes use two layers of hardmasks; the first hardmask etched through the first PR mask; and the second hardmask selectively etched through the second PR mask. In either case, the first PR mask is stripped before the second PR mask is formed.

An alternative approach of double patterning uses a protective layer for a first PR mask, which is formed before applying a second PR material onto the first PR mask. In general, when a liquid PR material is applied onto a wafer having a patterned PR mask, the polymer of the patterned PR mask would dissolve when it comes in contact with most organic solvents. Thus, another type of formulated system, such as a water soluble, acid cross-linkable coating material, can be used to form a protective layer onto the first PR mask so as to prevent the patterned PR mask from dissolving into an organic solvent of the second PR material. It is preferable that the solvent of the protective coating material does not dissolve the first PR so that the coating does not disturb the first patterned PR significantly. Suitable solvents may be water, fluorosolvents, silicon solvents, or polar solvents like methanol, ethanol or other similar alcohols. When a water-soluble, acid cross-linkable protective layer is applied on to the first PR mask and baked, the water is driven out and the residual amount of acid comes out from the first PR mask to its surface. Since the coating material is acid cross-linkable, a cross-linked polymer coat is formed on the surface of the first PR mask. Then, the coating material that is not cross-linked can be washed away, leaving the first PR pattern with the cross-linked polymer coat. This process may be referred to as "chemical freeze" of the first PR mask pattern as it "freezes" the shape of the first PR mask.

However, although it is water soluble polymer, the cross-linked protective layer coat still has affinity with the organic solvent. Thus, when the second PR material is liquid-applied on top of the coated first PR mask, the organic solvent of the liquid PR material causes the cross-linked area to form a "gel" and the first PR pattern swells and/or deforms, which in turn causes line-edge roughness (LER), line distortion and/or line lifting and defects. In addition, in order to preserve the original critical dimension (CD), it is preferable that the cross-linked coat on the first PR pattern is as thin as possible, but this exacerbates the deformation problems

SUMMARY OF THE INVENTION

To achieve the foregoing and in accordance with the purpose of the present invention a method for etching an etch layer formed on a substrate is provided. A first photoresist (PR) mask with it's first masked features is provided on the etch layer. A protective coating is provided on the first PR mask by a process including at least one cycle. Each cycle includes (a) a deposition phase for depositing a deposition layer over the surface of the first mask features using a deposition gas, and (b) a profile shaping phase for shaping the profile of the deposition layer using a profile shaping gas. A liquid PR material is applied over the first PR mask having the protective coating. The PR material is patterned into a second mask features, where the first and second mask features form a second PR mask. The etch layer is etched though the second PR mask In another embodiment of the invention an apparatus for providing a protective coating layer on a patterned photoresist (PR) mask with first mask features formed on an etch layer disposed on a substrate is provided. The apparatus includes a plasma processing chamber, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The apparatus further includes a gas source in fluid connection with the gas inlet, the gas source comprising a deposition gas source and a profile shaping gas source. A controller is controllably connected to the gas source and the at least one RF power source. The controller includes at least one processor and computer readable media. The computer readable media comprises computer readable code for providing a protective coating on a patterned PR mask comprising at least one cycle, the patterned mask having first mask features, wherein computer readable code for each cycle comprises computer readable code for flowing a deposition gas into the plasma chamber, computer readable code for forming a plasma from the deposition gas so as to deposit a deposition layer over the surface of the first mask features, computer readable code for stopping the flow of the deposition gas, computer readable code for flowing a profile shaping gas into the plasma chamber, computer readable code for forming a plasma from the profile shaping gas so as to shape the profile of the deposition layer; and computer readable code for stopping the flow of the deposition gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
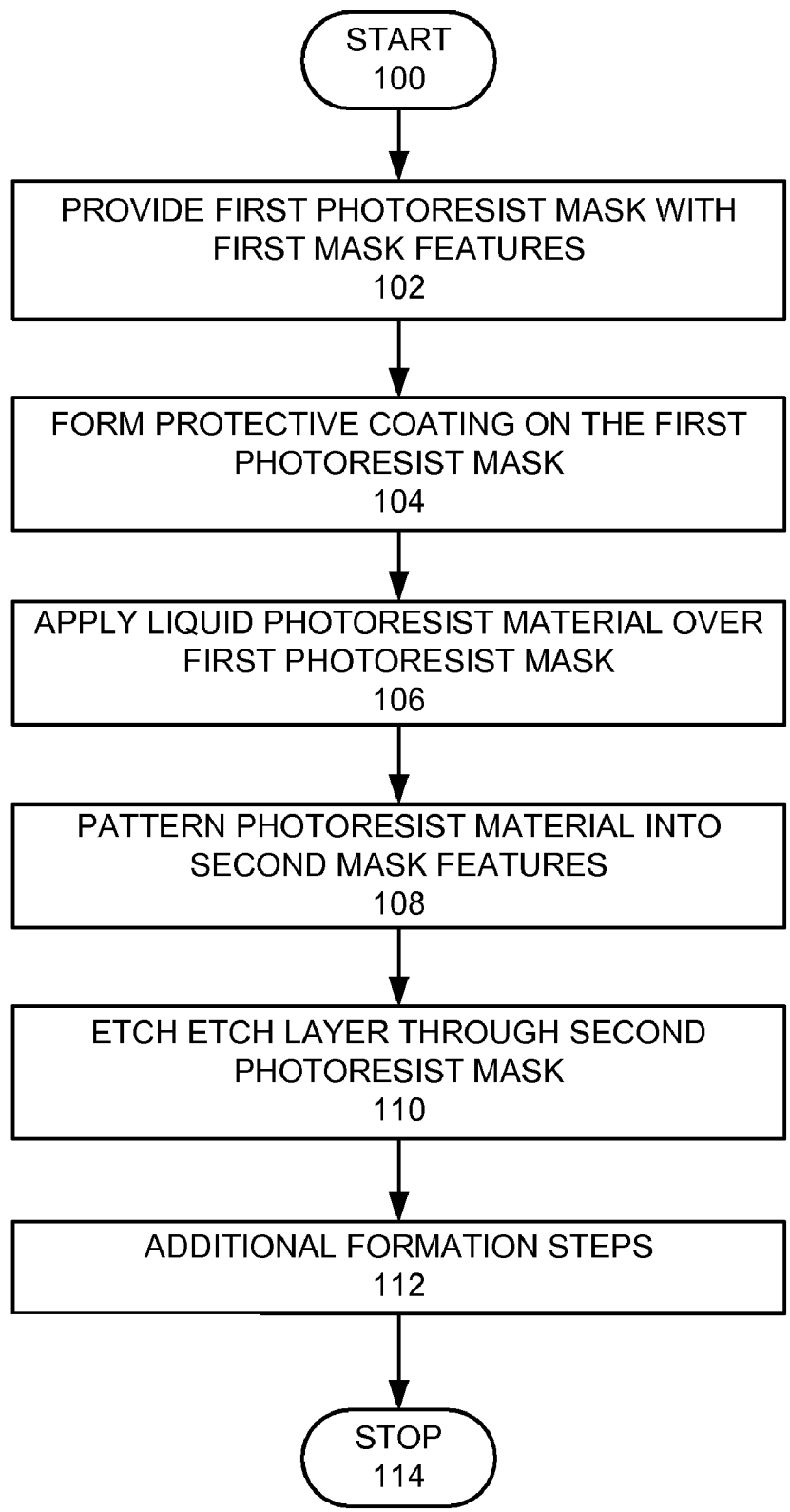
FIG. 1 is a high level flow chart of a process that may be used in an embodiment of the invention.
Figure 2A:
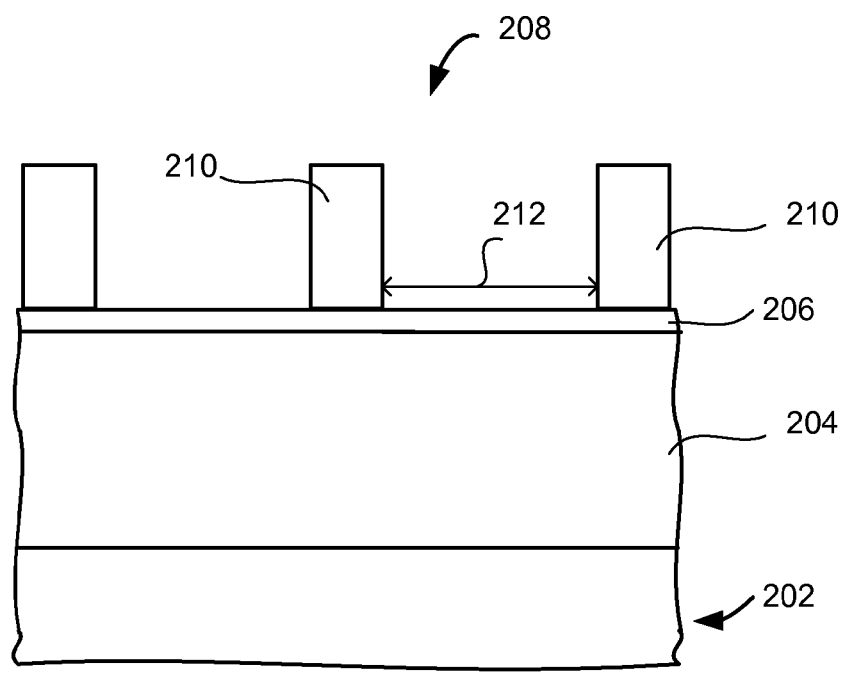
FIGS. 2A-2E are schematic cross-sectional views of a stack processed according to an embodiment of the invention.

The invention provides a novel "freeze" process for a PR mask which may be used, for example, in double-patterning process. To facilitate understanding, FIG. 1 is a high level flow chart of a process that may be used in an embodiment of the present invention. A first photoresist (PR) mask having first mask features is provided on an etch layer (step 102). FIG. 2A is a schematic cross-sectional view of a layer to be etched 204 (etch layer) formed over a substrate 202, with a first PR mask 208 having a first PR mask features 210. An antireflective coating (ARC) layer 206 may be formed over the etch layer 204 below the first PR mask 208. The ARC layer 206 may be organic or inorganic, and may include a bottom antireflective coating (BARC) and/or a SiON layer. The etch layer 204 may be an amorphous carbon layer (ACL) formed on a dielectric layer. Such an ACL may be used as a hardmask for etching the underlying dielectric layer. Amorphous carbon is similar to a polymer, but with less hydrogen and more carbon since it is deposited at high temperature greater than 200° C. by CVD, and thus it is more etch resistant than polymer. Alternatively, the etch layer 204 may be a dielectric layer such as TEOS. However, the present invention is applicable to any etch layers using a PR mask.

The first PR mask 208 may be patterned using a photolithography process, for example, the 193 nm water immersion lithography. However, the preset invention is also applicable to other lithography processes. Forming the first PR mask 208 may include liquid application of a PR material onto the wafer (by spin coating, for example), exposure to the light (scanning) using a first reticle, bake, and development. The water-soluble PR material may be washed away after the development. The first PR mask features 210 may have a typical critical dimension (CD), which may be the width of the space 212 between adjacent mask feature pattern 210, about 55 nm to 100 nm, using conventional photolithography processes.

Figure 2B:
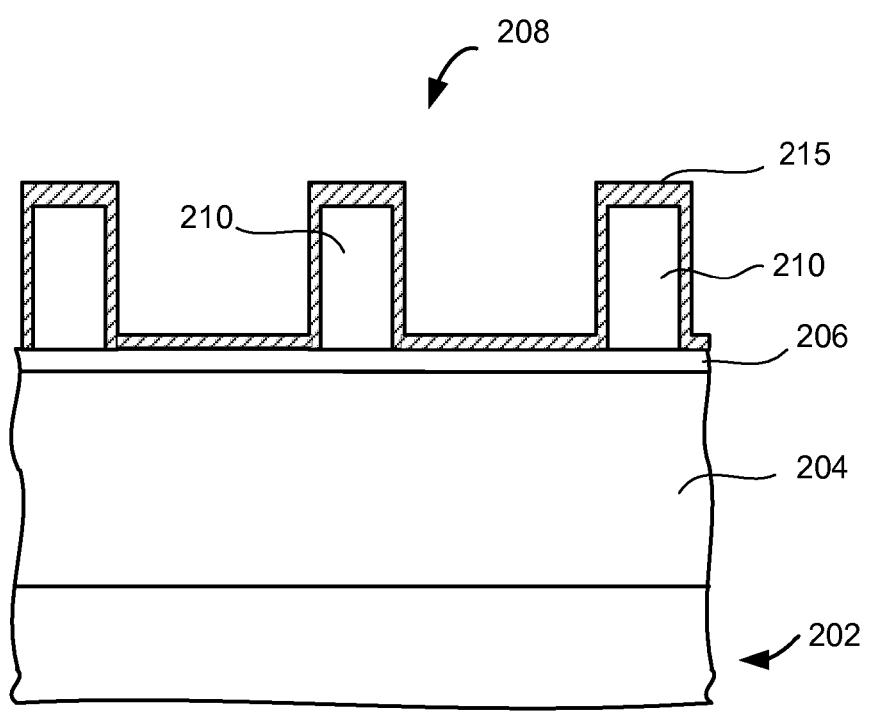
Figure 3:
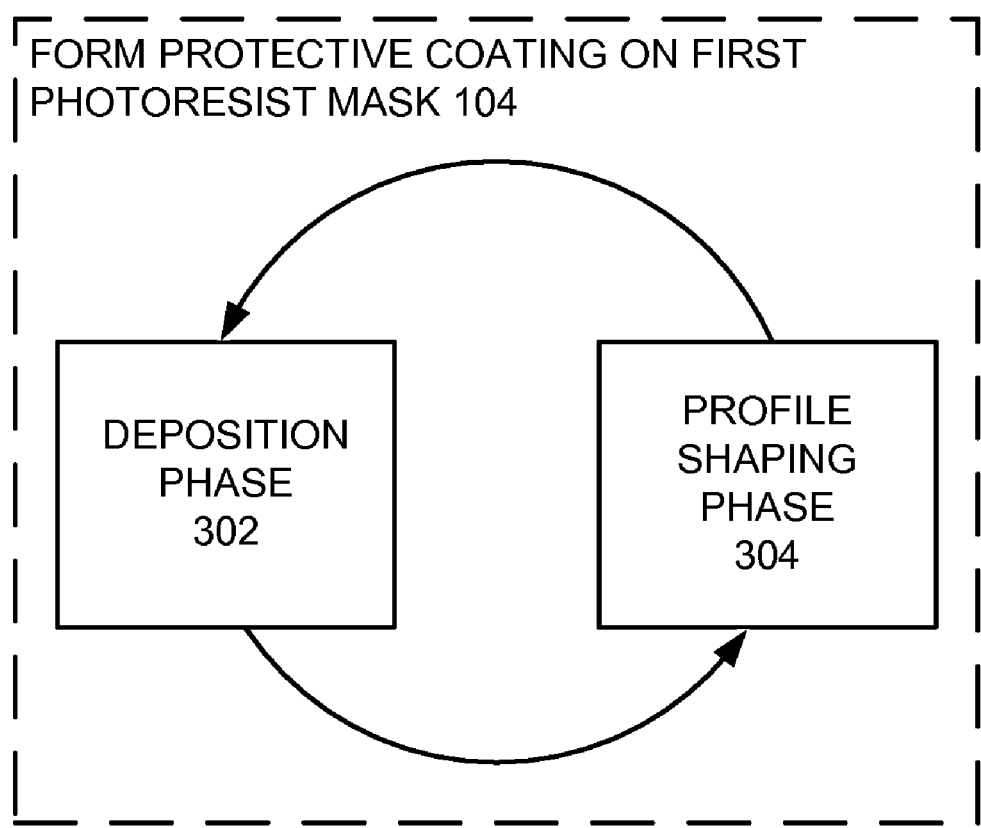
FIG. 3 is a more detailed flow chart of the step of forming a protective coating on the first PR mask in accordance with one embodiment of the present invention.

A protective coating is then formed on the first PR mask 208 (step 104). FIG. 3 is a more detailed flow chart of the step 104 for forming the protective coating on the first PR mask. In accordance with one embodiment of the present invention, the protective coating is formed by at least one cycle of a two-phase process including a deposition phase 302 and a profile shaping phase 304. Preferably, the two-phase cycle is repeated 1 to 10 times. More preferably, the two-phase cycle is repeated 2 to 3 times. In the deposition phase 302, a deposition layer is deposited over the surface of the first mask features 210 using a deposition gas. In this example, the deposition phase 302 comprises providing a deposition gas and generating a plasma from the deposition gas to form a deposition layer. In this example, the deposition gas has a polymer forming recipe. An example of such a polymer forming recipe is a hydrocarbon gas such as, $CH_4$, $C_2H_2$, and $C_2H_4$, and a fluorocarbon gas, such as $CH_3F$, $CH_2F_2$, $CHF_3$, $C_4F_6$, and $C_4F_8$. Another example of a polymer forming recipe would be a fluorocarbon chemistry and a hydrogen containing gas, such as a recipe of $CF_4$ and $H_2$. FIG. 2B is a schematic cross-sectional view of the deposition layer 215 formed over the first PR mask 208.

In the profile shaping phase 304, the deposition layer 215 is shaped or etched back using a profile shaping gas, such that at least the deposition layer 215 on the bottom of the mask features 210 is removed. The profile shaping phase 304 includes providing an profile shaping gas and generating an profile shaping plasma from the profile shaping gas to shape the profile of the deposition layer. The profile shaping gas is different from the deposition gas. As illustrated in FIG. 3, the deposition phase 302 and the profile shaping phase 304 occur at different times. In this example the profile shaping gas contains a fluorocarbon chemistry, such as $CF_4$, $CHF_3$, and $CH_2F_2$. Other gases such as $O_2$, $N_2$, and $H_2$ may be used.

Figure 2C:
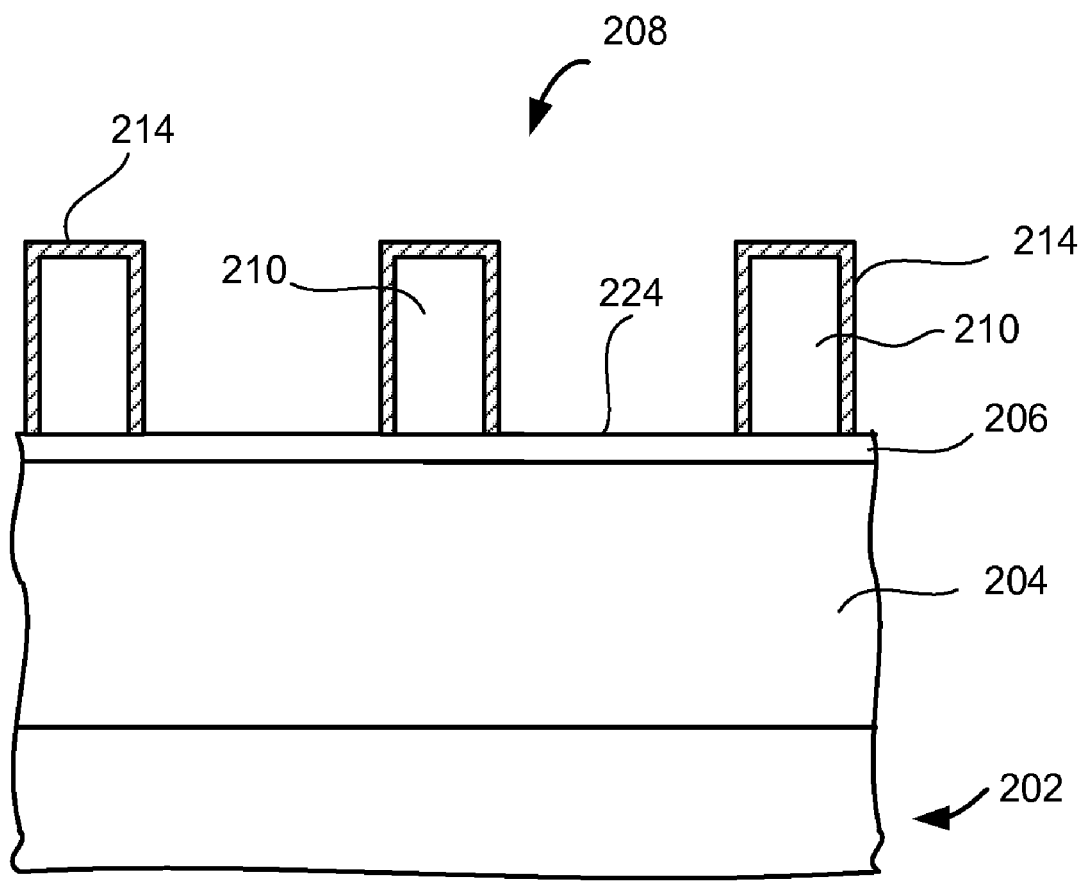

FIG. 2C is a schematic cross-sectional view of the first PR mask 208 with a protective coating layer 214 formed on the surface of the first mask features 210, after the deposition layer 215 is shaped by the profile shaping phase 304. The deposition-profile shaping cycle may be repeated more than once. Preferably, the protective coating is formed on the top and sidewalls of the first mask features 210, but not on the bottom 224 of the first mask features, as shown in FIG. 2C. That is, the protective coating layer 214 exposes the ARC 206. It is also desirable that the protective coating layer 214 has substantially vertical sidewalls which are highly conformal. An example of a substantially vertical sidewall is a sidewall that from bottom to top makes an angle of between 88° to 90° with the bottom of the feature. Conformal sidewalls of the protective coating layer have substantially the same thickness from the top to the bottom of the mask feature. Non-conformal sidewalls may form a faceting or a bread-loafing formation, which provide non-substantially vertical sidewalls. In addition, it is preferable that the protective coating layer 214 is as thin as possible so as not to affect the original deign CD. For example, the thickness of the protective coating layer 214 may be about 0.5 nm to 30 nm, and preferably, about 0.5 nm to 10 nm, and more preferably, 1 to 3 nm. The net thickness of the protective coating per cycle may be about 0.5 nm to 30 nm, preferably, about 0.5 nm to 5 nm, and more preferably, 1 to 3 nm. The number of cycles may depend on the total thickness of the protective coating layer and the net thickness of the protective layer per cycle.

Figure 4:
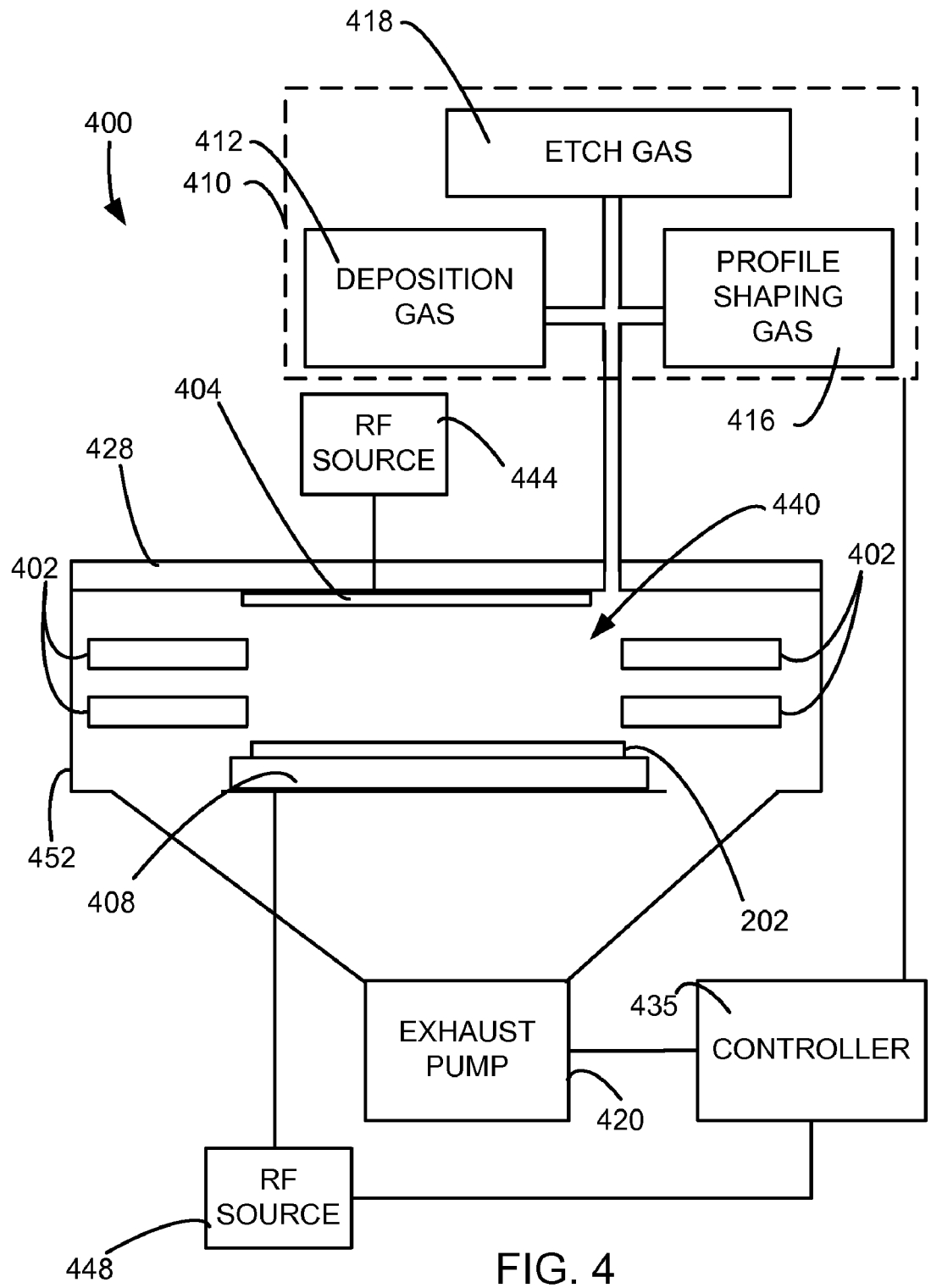
FIG. 4 is a schematic view of a plasma processing chamber that may be used in practicing the invention.

FIG. 4 is a schematic view of a plasma processing chamber 400 that may be used for providing the protective layer on the first PR mask in accordance with one embodiment of the present invention. The plasma chamber 400 may also used for subsequent etching process and stripping after the second PR mask is formed. The plasma processing chamber 400 comprises confinement rings 402, an upper electrode 404, a lower electrode 408, a gas source 410, and an exhaust pump 420. The gas source 410 comprises a deposition gas source 412 and a profile shaping gas source 416. The gas source 410 may comprise additional gas sources, such as an etching gas source 418 and a gas source for mask stripping (not shown).

Within plasma processing chamber 400, the substrate 202 is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 60 MHz power source, a 27 MHz power source and a 2 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 60 MHz, 27 MHz, and 2 MHz power sources make up the second RF power source 448 connected to the lower electrode, and the upper electrode is grounded.

A controller 435 is controllably connected to the RF sources 444, 448, exhaust pump 420, and the gas source 410. The Dielectric Etch System would be used when the etch layer 204 is a dielectric layer, such as silicon oxide, organo silicate glass, or TEOS. The Dielectric Etch System may also used for etching or opening hardmask. The controller 435 controls the RF sources 444, 448, exhaust pump 420, the deposition gas source 412, and the profile shaping gas source 416, and alternately performs the deposition and the profile shaping as two phases of a cycle. Using the two-phase cycle, which may be repeated more than once, the protective coating is formed so as to cover the surface of the first PR mask features without covering the bottom of the mask features.

Figure 5A:
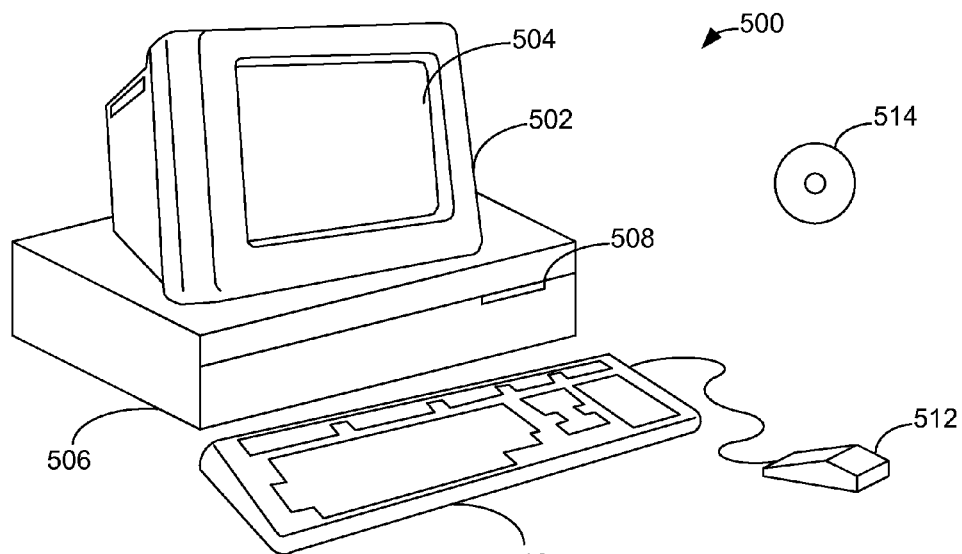
FIGS. 5A-5B illustrate a computer system, which is suitable for implementing a controller used in embodiments of the present invention.
Figure 5B:
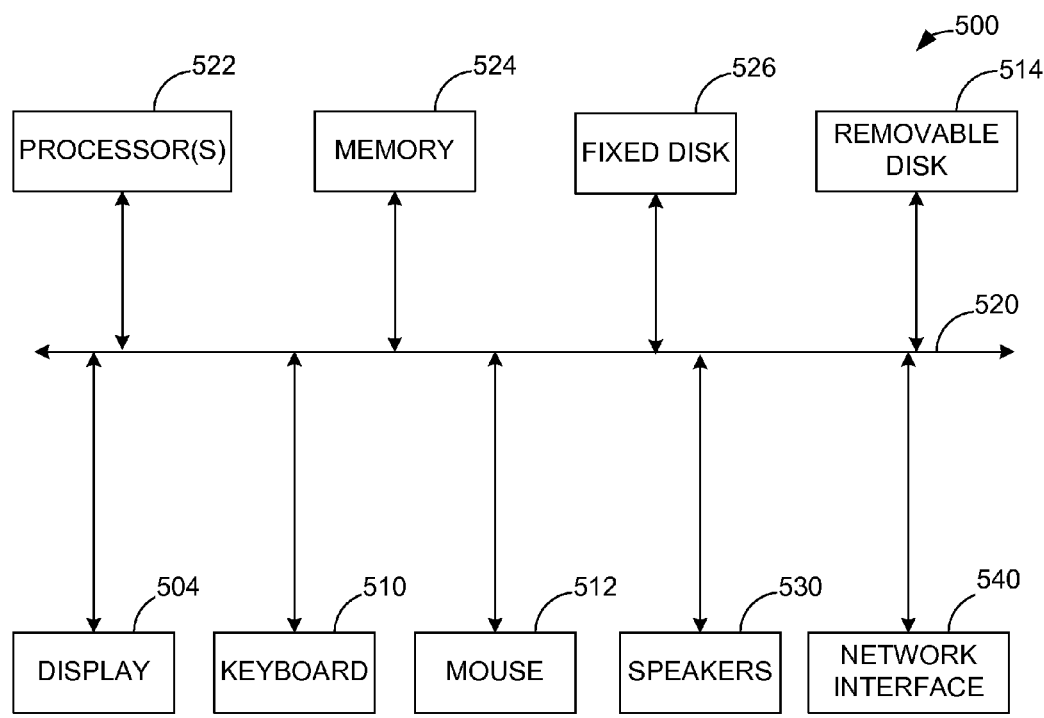

FIGS. 5A and 5B illustrate a computer system 500, which is suitable for implementing a controller 435 (in FIG. 4) used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512 and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

One example of the deposition gas would be a fluorocarbon chemistry and a hydrogen containing gas, such as a recipe of $CF_4$ and $H_2$. In this example, power is supplied at 400 watts at 2 MHz and 800 watts at 27 MHz. In each deposition phase, the deposition gas with the first chemistry is provided in the chamber, a plasma is from the deposition gas, and the deposition gas is stopped after the deposition.

One example of the profile shaping gas has a fluorocarbon chemistry, such as $CF_4$, $CHF_3$, and $CH_2F_2$. Other gases such as $O_2$, $N_2$, and $H_2$ may be used. In this example, power is supplied at 0 watts at 2 MHz and 800 watts at 27 MHz. In each profile shaping phase, the profile shaping gas with the second chemistry is provided in the chamber, a plasma is formed from the profile shaping gas, and the profile shaping gas is stopped after the profile shaping.

The deposition phase 302 and the profile shaping phase 304 may be continuously performed in the same chamber without extinguishing the plasma, and the cycle may be repeated more than one, preferably 2-3 times. By controlling various parameters, such as the process times of the deposition phase 302 and the profile shaping phase 304, number of cycles, total deposition time, deposition/profile-shaping time ratio, gas chemistry ratio in each chemistry, the protective coating 214 can be formed in a desirable shape with a desirable thickness.

Referring back to FIG. 1, after forming the protective coating 214 on the first PR mask (step 104), a liquid PR material is applied over the first PR mask (step 106). The second liquid application of the PR material may be performed in a similar manner as the first application of the PR material for the first PR mask, for example, by spin-coating. The liquid PR material contains an organic solvent such as PEGMIA. The protective coating 214 protects the first mask features from deterioration by the organic solvent. Since the protective coating 214 is formed by vapor phase deposition, not from the PR material, it does not have affinity with the solvent in the liquid PR material. Thus, the protective coating allows no or little solvent to go though the protective coating, and thus there is no or little interaction between the patterned first PR mask and the liquid PR material applied thereon. Accordingly, the patterned first mask features maintain their original shape, such as the original line pattern, protected by the protective coating.

Figure 2D:
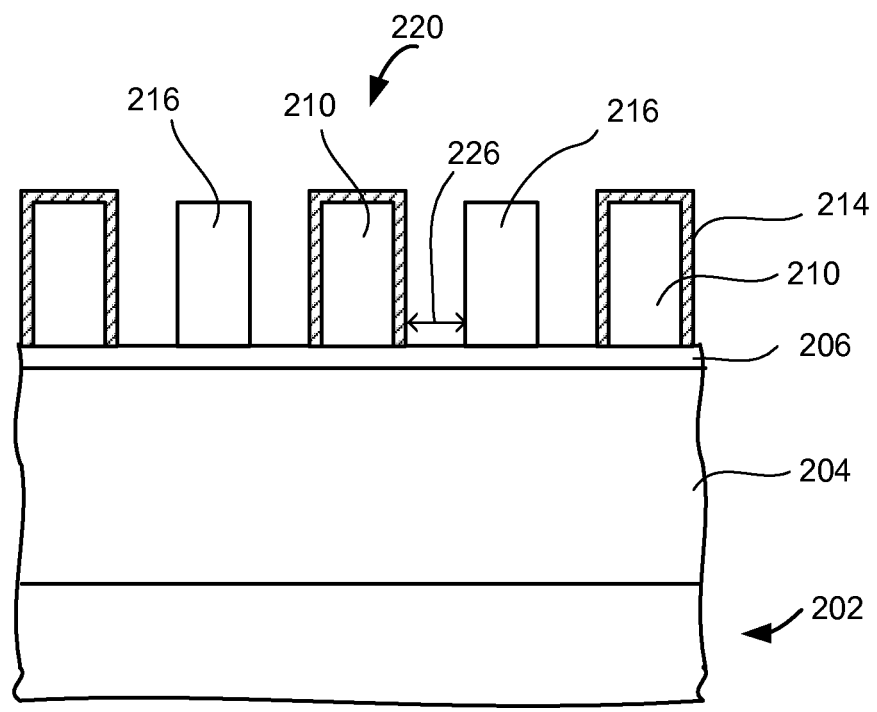
Figure 2E:
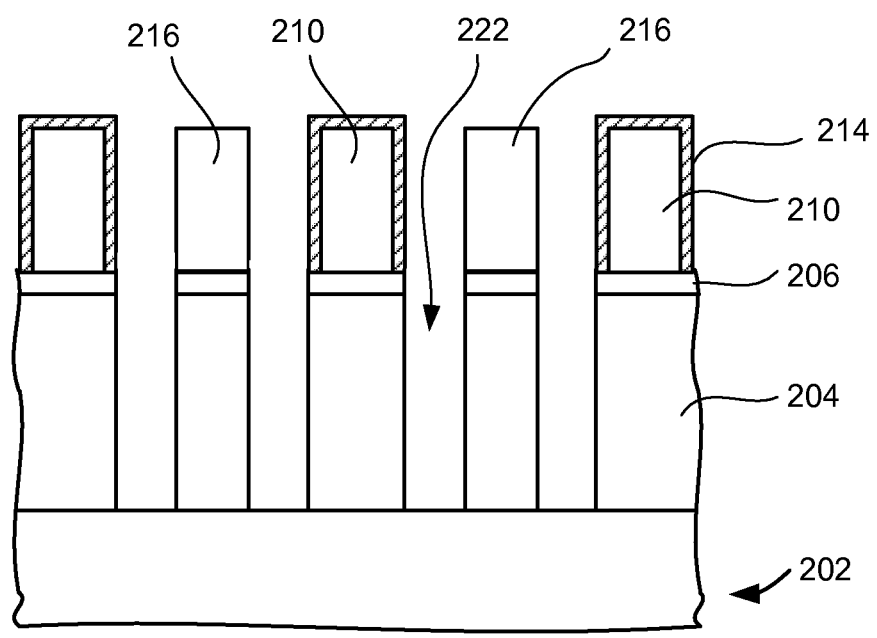

Then, the second-applied PR material is patterned into second mask features 216 (step 108). Patterning of the PR material into the second mask features may be performed in a similar manner as the patterning of the first PR mask, for example, conventional photolithography process, using a second reticle corresponding to the second mask features. FIG. 2D is a schematic cross-sectional view of a second PR mask 220 including the first mask features 208 and the second mask features 216. That is, the first mask features 208 and the second mask features 216 combined together form the second PR mask 220. As shown in FIG. 2D, in accordance with one embodiment of the present invention, the second mask features 216 are provided between the first mask features 208. For example, in the case of a line pattern, the first mask features 208 and the second mask features 216 are alternately formed to achieve a smaller CD 226, for example, about 32 nm to 45 nm. However, the present invention is not limited to line patterns, but can be applicable to any design pattern splitting where a two dimensional design pattern is split into two separate reticles, i.e., two set of PR mask features. The substrate 202 is placed in the chamber, and the etch layer 204 is etched though the second PR mask (step 110). FIG. 2E shows a feature 222 etched into the etch layer 204.

Additional formation steps (112) may then be performed. For example, the PR mask 220 may be stripped, and/or the subsequent etch step may be performed to pattern features in the underlying layer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching an etch layer formed on a substrate, comprising;
   providing a first photoresist (PR) mask with first mask features on the etch layer;
   forming a protective coating on the first PR mask, comprising at least one cycle including:
      a deposition phase for depositing a deposition layer over the surface of the first mask features using a deposition gas; and
      a profile shaping phase for shaping the profile of the deposition layer using a profile shaping gas;
   applying a liquid PR material over the first PR mask having the protective coating;
   patterning the PR material into a second mask features, the first and second mask features forming a second PR mask; and
   etching the etch layer though the second PR mask.

2. The method as recited in claim 1, wherein the liquid PR material contains an organic solvent and wherein the protective coating protects the first features from deterioration by the organic solvent.

3. The method as recited in claim 1, wherein the second mask features are provided between the first mask features.

4. The method as recited in claim 1, wherein each deposition phase comprises:
   providing the deposition gas with a first chemistry;
   forming a plasma from the deposition gas; and
   stopping the deposition gas.

5. The method as recited in claim 4, wherein each profile shaping phase comprises:

providing the profile shaping gas with a second chemistry different from the first chemistry;
forming a plasma from the profile shaping gas; and
stopping the profile shaping gas.

6. The method as recited in claim 1, wherein the cycle is repeated one to three times.

7. The method as recited in claim 1, wherein the cycle is repeated such that the protective coating has a thickness of about 0.5 to 3 nm.

8. The method as recited in claim 1, wherein the protective coating has a thickness that is small enough so as not to affect an original CD of the first PR mask.

9. A method for etching an etch layer formed on a substrate, comprising;
providing a first photoresist (PR) mask with first mask features on the etch layer;
forming a protective coating on the first PR mask, comprising at least one cycle including:
  a deposition phase for depositing a deposition layer over the surface of the first mask features using a deposition gas; and
  a profile shaping phase for shaping the profile of the deposition layer using a profile shaping gas;
applying a liquid PR material over the first PR mask having the protective coating;
patterning the PR material into a second mask features, the first and second mask features forming a second PR mask; and
etching the etch layer though the second PR mask, wherein the protective coating is formed on a top and sidewalls of the first mask features, but not on a bottom of the first mask features.

10. A method for etching an etch layer formed on a substrate, comprising;
providing a first photoresist (PR) mask with first mask features on the etch layer;
forming a protective coating on the first PR mask, comprising at least one cycle including:
  a deposition phase for depositing a deposition layer over the surface of the first mask features using a deposition gas; and
  a profile shaping phase for shaping the profile of the deposition layer using a profile shaping gas;
applying a liquid PR material over the first PR mask having the protective coating;
patterning the PR material into a second mask features, the first and second mask features forming a second PR mask; and
etching the etch layer though the second PR mask, wherein the shaping the profile of the deposition layer includes:
removing a portion of the deposition layer on a bottom of the first mask features.

* * * * *